United States Patent
Gehring et al.

(10) Patent No.: US 8,652,913 B2
(45) Date of Patent: Feb. 18, 2014

(54) METHOD FOR FORMING SILICON/GERMANIUM CONTAINING DRAIN/SOURCE REGIONS IN TRANSISTORS WITH REDUCED SILICON/GERMANIUM LOSS

(75) Inventors: Andreas Gehring, Dresden (DE); Maciej Wiatr, Dresden (DE); Andy Wei, Dresden (DE); Thorsten Kammler, Ottendorf-Okrilla (DE); Roman Boschke, Dresden (DE); Casey Scott, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1292 days.

(21) Appl. No.: 11/778,930

(22) Filed: Jul. 17, 2007

(65) Prior Publication Data
US 2008/0182371 A1    Jul. 31, 2008

(30) Foreign Application Priority Data
Jan. 31, 2007    (DE) .......................... 10 2007 004 862

(51) Int. Cl.
*H01L 21/336*    (2006.01)
(52) U.S. Cl.
USPC .............. 438/300; 257/E21.43; 257/E21.431; 257/E29.267
(58) Field of Classification Search
USPC ........... 438/300, 478; 257/E21.131, E21.165, 257/E21.43, E21.431, E29.267
See application file for complete search history.

(56) References Cited

U.S. PATENT DOCUMENTS

| | | | |
|---|---|---|---|
| 6,165,826 A * | 12/2000 | Chau et al. | 438/231 |
| 6,794,713 B2 | 9/2004 | Mizushima et al. | 257/327 |
| 7,071,014 B2 | 7/2006 | Currie et al. | 438/26 |
| 7,176,522 B2 * | 2/2007 | Cheng et al. | 257/338 |
| 7,405,131 B2 * | 7/2008 | Chong et al. | 438/300 |
| 2004/0092051 A1 | 5/2004 | Currie et al. | 438/22 |
| 2005/0184345 A1 | 8/2005 | Lin et al. | 257/375 |
| 2006/0065914 A1 | 3/2006 | Chen et al. | 257/288 |

FOREIGN PATENT DOCUMENTS

| | | | |
|---|---|---|---|
| DE | 102004033147 | 7/2004 | ............ H01L 21/336 |
| DE | 102005030583 | 6/2005 | ............ H01L 21/336 |
| EP | 1 677 360 A2 | 7/2006 | ............. H01L 29/78 |

OTHER PUBLICATIONS

Kim et al., "Suppression of Defect Formation and Their Impact on Short Channel Effects and Drivability of pMOSFET with SiGe Source/Drain," 2006 International Electron Devices Meeting.
International Search Report and Written Opinion from PCT/US2008/001292 dated Jul. 10, 2008.
Translation of Official Communication from German Patent Office for German Patent Application No. 10 2007 004 862.0-33 dated Oct. 4, 2007.
Widmann, Mader and Friedrich, "Technologie hochintegrierter Schaltungen," $2^{nd}$ ed., Springer, pp. 312-313, 1996.
Translation of Official Communication from German Patent Office for German Patent Application No. 10 2007 004 862.0 dated Jul. 9, 2010.

* cited by examiner

*Primary Examiner* — David Vu
(74) *Attorney, Agent, or Firm* — Amerson Law Firm, PLLC

(57)    ABSTRACT

By providing a protection layer on a silicon/germanium material of high germanium concentration, a corresponding loss of strained semiconductor material may be significantly reduced or even completely avoided. The protection layer may be formed prior to critical cleaning processes and may be maintained until the formation of metal silicide regions. Hence, high performance gain of P-type transistors may be accomplished without requiring massive overfill during the selective epitaxial growth process.

16 Claims, 7 Drawing Sheets

METHOD FOR FORMING SILICON/GERMANIUM CONTAINING DRAIN/SOURCE REGIONS IN TRANSISTORS WITH REDUCED SILICON/GERMANIUM LOSS

BACKGROUND OF THE INVENTION

1. Field of the Invention

Generally, the present disclosure relates to the formation of integrated circuits, and, more particularly, to the transistors having enhanced performance by using silicon/germanium (Si/Ge) in the drain/source regions so as to enhance charge carrier mobility in the channel region of a PMOS transistor.

2. Description of the Related Art

The fabrication of integrated circuits requires the formation of a large number of circuit elements, wherein the field effect transistor may represent an important component in advanced logic circuit designs. Generally, a plurality of process technologies are currently practiced for forming field effect transistors, wherein, for complex circuitry, such as micro-processors, storage chips and the like, CMOS technology is currently the most promising approach, due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The continuing shrinkage of the transistor dimensions, however, entails a plurality of issues associated therewith that have to be addressed so as to not unduly offset the advantages obtained by steadily decreasing the channel length of MOS transistors. For example, with reduced channel length, the controllability of the channel region may be become increasingly difficult, which is also referred to as short channel effects. Hence, various design measures, such as sophisticated dopant profiles, increased capacitive coupling of the gate electrode to the channel region and the like, have been developed, some of which may, however, negatively affect the charge carrier mobility in the channel region. In view of this situation, and since the continuous size reduction of the critical dimensions, i.e., the gate length of the transistors, necessitates the adaptation and possibly the new development of highly complex process techniques, it has been proposed to also enhance the channel conductivity of the transistor elements by increasing the charge carrier mobility in the channel region for a given channel length, thereby offering the potential for achieving a performance improvement that is comparable with the advance to a future technology node while avoiding or at least postponing many of the above process adaptations associated with device scaling.

One efficient mechanism for increasing the charge carrier mobility is the modification of the lattice structure in the channel region, for instance by creating tensile or compressive stress to produce a corresponding strain in the channel region, which results in a modified mobility for electrons and holes, respectively. For example, creating uniaxial tensile strain in the channel region along the channel increases the mobility of electrons, which, in turn, may directly translate into a corresponding increase in the conductivity of N-channel transistors. On the other hand, compressive strain in the channel region may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor material, which may enable the fabrication of fast powerful semiconductor devices without requiring new expensive semiconductor materials and manufacturing techniques adapted to these new materials.

An efficient mechanism for enhancing the hole mobility of PMOS transistors may be implemented by forming a strained silicon/germanium layer in the drain and source regions of the P-channel transistors, wherein the compressively strained drain and source regions create uniaxial strain in the adjacent silicon channel region. To this end, the drain and source regions of the PMOS transistors are selectively recessed, while the NMOS transistors are masked and the silicon/germanium layer is subsequently selectively formed in the PMOS transistor by epitaxial growth. Although this technique offers significant advantages in view of performance gain of the PMOS transistor and thus of the entire CMOS device, if an appropriate design is used that balances the performance gain of the PMOS transistor, a performance gain less than expected may be obtained in advanced applications, when higher germanium concentrations are used to further enhance the strain level in the channel region and thus increase the hole mobility.

With reference to FIGS. 1a-1c, a typical process flow will now be described in more detail in order to illustrate the problems involved in the conventional process strategy when using moderately high germanium concentrations.

FIG. 1a schematically illustrates a cross-sectional view of a semiconductor device 100 comprising a substrate 101 which may represent any appropriate carrier material for forming thereon a substantially crystalline silicon layer 102. For instance, the substrate 101 and the semiconductor layer 102 may represent a silicon-on-insulator (SOI) configuration, wherein the semiconductor layer 102 may be directly formed on a respective buried insulating layer (not shown), which may be comprised of any appropriate material, such as silicon dioxide and the like. Furthermore, at this manufacturing stage, the semiconductor device 100 comprises a first transistor 110p and a second transistor 110n, which may represent a P-type transistor and an N-type transistor, respectively. At this manufacturing stage, each of the first and second transistors 110p, 110n may comprise a gate electrode 111, formed on a corresponding gate insulation layer 112, which separates the gate electrodes 111 from respective channel regions 113, which represent a portion of a respective "active region" of the semiconductor layer 102, in which respective drain and source regions are to be formed at a later stage. Thus, the term "active region" in the context of a transistor element is to be understood as a semiconductor region exhibiting a specified dopant profile for adjusting the overall conductivity of the semiconductor material, wherein at least one PN junction may be provided. Furthermore, the respective gate electrodes 111 may have formed on a top surface thereof respective cap layers 104, such as silicon nitride layers and the like.

As previously explained, the performance of P-type transistors may be significantly enhanced by providing a respective silicon/germanium material within the active region of the transistor in order to create a respective strain in the corresponding channel region. In order to appropriately position the silicon/germanium material in the respective active region, the device 100 may be prepared so as to form respective recesses in the first transistor 110p adjacent to the gate electrode 111. For this purpose, respective spacer elements 103S may be provided on the sidewalls of the gate electrode 111 of the transistor 110p in order to provide, in combination with the corresponding cap layer 104, for a reliable confinement of the gate electrode 111 during a subsequent etch process. Since a corresponding recess and a silicon/germanium material may not be required in the N-channel transistor 110n, a corresponding spacer layer 103 may be formed to cover the gate electrode 111 and the respective portions of the semiconductor layer 102 adjacent to the gate electrode 111 in the transistor 110n. Furthermore, a corresponding resist mask 105 may be provided to cover the second transistor 110n, including the spacer layer 103.

The semiconductor device 100 as shown in FIG. 1a may be formed on the basis of the following processes. After forming respective isolation structures (not shown) and creating a desired vertical dopant profile in the semiconductor layer 102 as is required for the transistor behavior of the first and second transistors 110p, 110n, the gate insulation layer may be formed by deposition and/or oxidation followed by the deposition of an appropriate gate electrode material. Thereafter, sophisticated patterning processes may be performed, which may include advanced photolithography, sophisticated etch techniques and the like in order to obtain the gate electrodes 111 and the gate insulation layers 112. In the same process sequence, the capping layers 104 may also be patterned, which may also be used as an anti-reflective coating (ARC) layer during the respective sophisticated lithography sequences. Thereafter, the spacer layer 103 may be deposited, for instance on the basis of well-established plasma enhanced chemical vapor deposition (PECVD) techniques, thereby providing the spacer layer 103 with an appropriate layer thickness. The spacer layer 103 may be formed on the basis of any appropriate material having a high etch selectivity during a subsequent etch process for forming respective recesses or cavities in the first transistor 110p, for instance, silicon nitride may be efficiently used. Next, the resist mask 105 may be formed using lithography techniques and thereafter an anisotropic etch process 106 may be performed in order to remove the material of the spacer layer 103 from horizontal portions of the first transistor 110p, thereby, creating the spacers 103S, the width of which may thus be substantially determined by the initial layer thickness of the spacer layer 103 and the process parameters of the etch process 106.

Thereafter, a further etch process may be performed on the basis of a well-established etch recipe for removing exposed silicon material from the semiconductor layer 102 selectively to the material of the spacer layer 103 and the spacers 103S. The corresponding etch process may be performed as a substantially anisotropic process or may have a certain degree of isotropy, at least in an advanced phase of the etch process, depending on device requirements. Thus, respective silicon material may be removed, as indicated by the dashed lines, wherein, in an SOI configuration, at least a minimum crystalline silicon material may be maintained, which may act as a growth template during the further processing of the device 100.

FIG. 1b schematically illustrates the semiconductor device 100 at a further advanced manufacturing stage. The semiconductor device 100 is exposed to a deposition ambient 107, in which respective process parameters are appropriately adjusted so as to obtain a selective epitaxial growth of silicon/germanium material 117, wherein a corresponding deposition on dielectric materials, such as the spacer layer 103 and the spacers 103S and the cap layer 104 may be substantially avoided. Consequently, the respective silicon/germanium material may be substantially grown within the previously formed recesses or cavities, wherein the silicon/germanium material 117 may take on substantially the same lattice spacing as the remaining silicon material acting as a growth template. Consequently, after filling the recesses, the corresponding silicon/germanium material 117 may be provided in the form of a strained material, since the natural lattice spacing of silicon/germanium may be slightly greater compared to the silicon lattice spacing. Therefore, a corresponding stress component may be exerted on the channel region 113, thereby creating a respective compressive strain therein. Since the degree of lattice mismatch between the natural lattice spacing of the silicon/germanium material 117 and the silicon material may substantially determine the finally obtained strain in the channel region 113, typically moderately high germanium concentrations of approximately 20 atomic percent or even more may be incorporated into the material 117 in view of further performance gain for the transistor 110p. Thereafter, the respective spacers 103S and the spacer layer 103 may be removed and further manufacturing processes are performed in order to complete the transistor devices 100n, 100p.

FIG. 1c schematically illustrates the device 100 at a further advanced manufacturing stage. Here, the transistors 110n, 110p may comprise respective drain and source regions 114, which may have any appropriate lateral and vertical dopant profiles in accordance with device requirements. For this purpose, a respective spacer structure 115 may be provided to act as an appropriate implantation mask during preceding implantation sequences for forming the drain and source regions 114. However, in the P-channel transistor 110p, the drain and source regions 114 have a significantly reduced height level compared to the N-channel transistor 110n. The corresponding recess 117R may therefore result in a significantly reduced performance gain or may even result in a reduced performance compared to a device having a lower germanium concentration for otherwise identical design, since generally the amount of strain created in the channel region 113 may be significantly less, since the horizontal stress component provided by the strained silicon/germanium material 117 may be exerted at a significantly lower height level, thereby reducing the corresponding strain prevailing immediately below the respective gate insulation layer 112. Moreover, with the missing silicon/germanium material, a significant amount of dopants may also be lost, thereby further reducing the expected performance gain due to a reduced conductivity of the drain and source regions 114. It turns out that the size of the corresponding recess 117R may be correlated to the amount of concentration of germanium within the material 117, thereby compensating or even overcompensating for the advantageous effect of an increased lattice mismatch between the silicon/germanium material 117 and the initial silicon material at high germanium concentrations.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to an enhanced technique for forming transistor devices on the basis of strained silicon/germanium material, in which undue material loss during the manufacturing processes may be reduced. It has been recognized that certain manufacturing processes and in particular respective cleaning steps may be responsible for a significant material loss in areas in which a moderately high germanium concentration is incorporated in the silicon material. For example, for germanium concentrations above 20 atomic percent, a significantly reduced performance gain may be obtained caused by a degraded stress transfer and respective dopant loss. According to the strategy disclosed herein, the corresponding material loss and the disadvantages associated therewith may be substantially avoided or at least reduced by forming an appropriate protection layer prior to performing critical process steps, such as cleaning processes, in order to protect the underlying silicon/germanium material from corresponding aggressive chemistries. Thus, a respective loss of dopants may be significantly reduced or avoided, while, at the same time, the height level of the stress-inducing silicon/germanium material may be adapted more closely to the height level of the channel region.

According to one illustrative embodiment, a method comprises forming a strained silicon/germanium material in a recess formed adjacent to a masked gate electrode of a P-type transistor. The method further comprises forming a protection layer on the strained silicon/germanium material and forming drain and source regions in the P-type transistor in the presence of the protection layer.

According to another illustrative embodiment, a method comprises selectively forming a protection layer on a silicon/germanium material that is formed in an active region of a P-type transistor. The method further comprises forming drain and source regions in the active region of the P-type transistor and in an active region of an N-type transistor, while the protection layer selectively covers the silicon/germanium material.

According to yet another illustrative embodiment, a method comprises depositing a protection layer on a silicon/germanium material formed in an active region of a P-type transistor. Furthermore, at least some manufacturing processes are performed in the presence of the protection layer. Thereafter, the protection layer is removed prior to forming a metal silicide in the P-type transistor.

BRIEF DESCRIPTION OF THE DRAWINGS

The disclosure may be understood by reference to the following description taken in conjunction with the accompanying drawings, in which like reference numerals identify like elements, and in which.

Figure 1A:
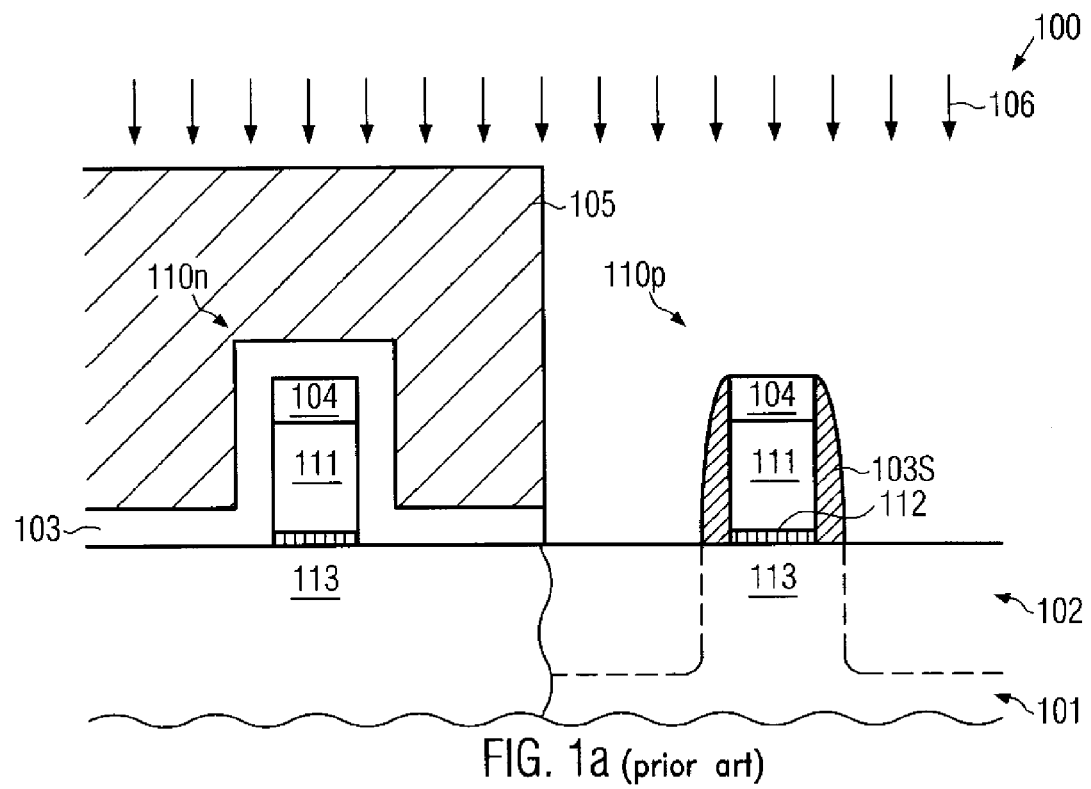
FIGS. 1a-1c schematically illustrate cross-sectional views of a semiconductor device comprising a P-type transistor and an N-type transistor during a conventional process flow, in which a strained silicon/germanium material may be incorporated in the P-type transistor, resulting in significant material loss.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1B:
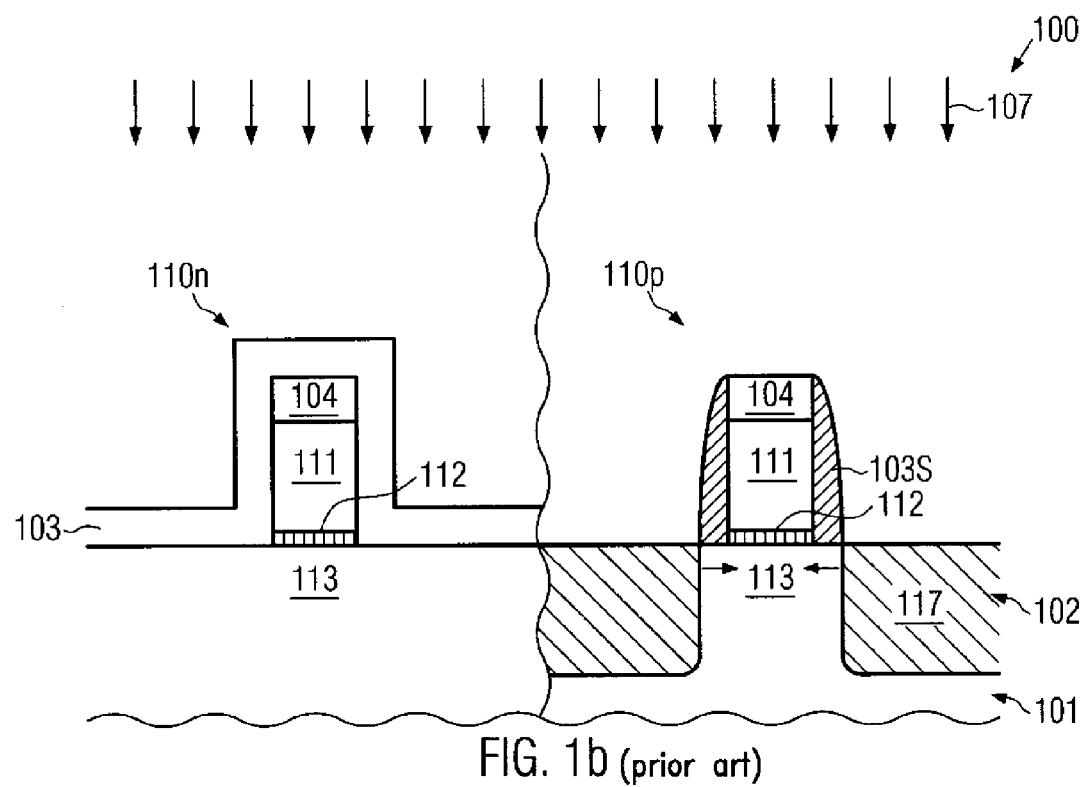
Figure 1C:
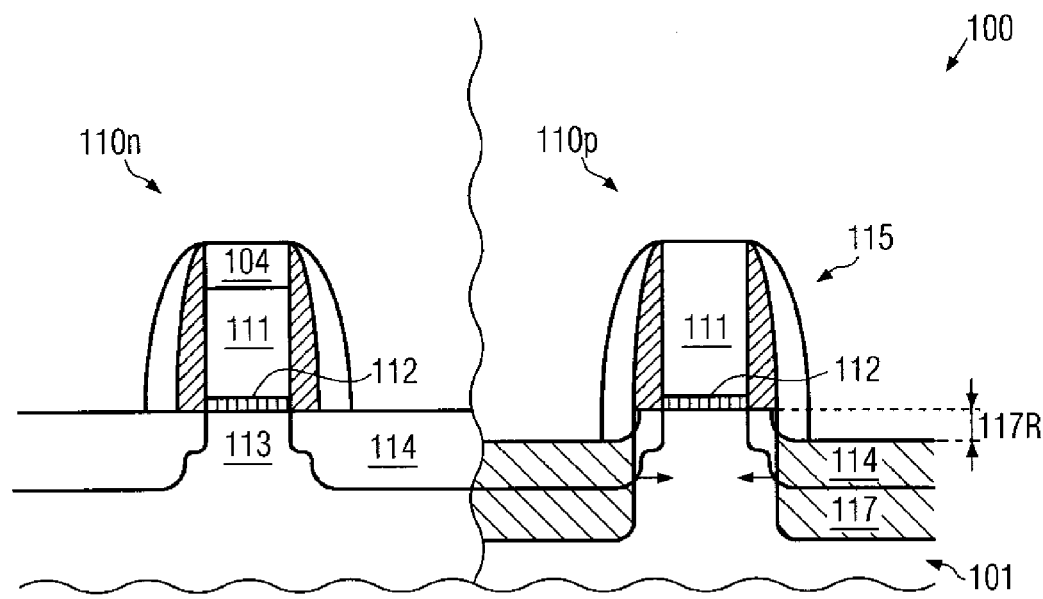

Generally, the subject matter disclosed herein provides efficient manufacturing techniques which may enable a significant reduction of disadvantageous effects on the performance of P-type transistors when using silicon/germanium materials in the respective drain and source areas with a high concentration of germanium. As previously explained, with germanium concentrations of 20% and even more, which would be highly desirable in view of enhancing the corresponding strain-inducing mechanism, in conventional techniques, a significantly reduced performance gain or even a reduced performance may be observed. In order to reduce the corresponding material loss during the formation of P-type transistors, it is contemplated to provide an efficient protection layer at an appropriate manufacturing stage to reduce or substantially avoid undue dopant loss and degradation of the corresponding strain-inducing mechanism. In some aspects, the corresponding protection layer may be formed in a self-aligned manner in order to cover the relevant portions in the P-type transistor with the protection layer, while substantially not affecting other device areas, such as N-type transistors and the like. In this manner, well-established process strategies for the N-type transistors may be used, while, at the same time, a significant enhancement of the P-type transistor performance may be accomplished with minor process adaptations. For instance, in some embodiments, a corresponding self-aligned behavior of the process for forming the protection layer may be accomplished on the basis of an appropriately designed surface modification process, such as an oxidation process, wherein a respective masking material, as is typically provided during the selective epitaxial growth process, may also be efficiently used as an oxidation mask. In other aspects, the significantly different oxidation rate of silicon/germanium material including high germanium concentration compared to silicon and polysilicon materials may be exploited in order to form oxide layers of different thickness in a P-type transistor and an N-type transistor. In some illustrative embodiments, a minor additional consumption of silicon/germanium material during a corresponding surface treatment of the silicon/germanium material may be compensated for by a moderate increase of the fill height during the epitaxial growth process. Since the corresponding consumption of silicon/germanium material during the surface modification, such as an oxidation, is significantly less compared to the material loss encountered in conventional strategies as described for instance with reference to FIGS. 1a-1c, nevertheless, any significant process modifications and throughput losses may be substantially avoided, since the additional process time required for compensating for the material consumption in forming the protection layer may be significantly less as compared to a respective compensation of material loss without a protection layer, as might be used in the conventional process technique. In still other illustrative embodiments, an efficient protection layer may be formed by deposition techniques substantially without consuming silicon/germanium material as deposited, thereby providing a high degree of compatibility with conventional process strategy, while avoiding or at least substantially reducing any negative impacts on P-transistor performance when using high germanium concentrations.

Figure 2A:
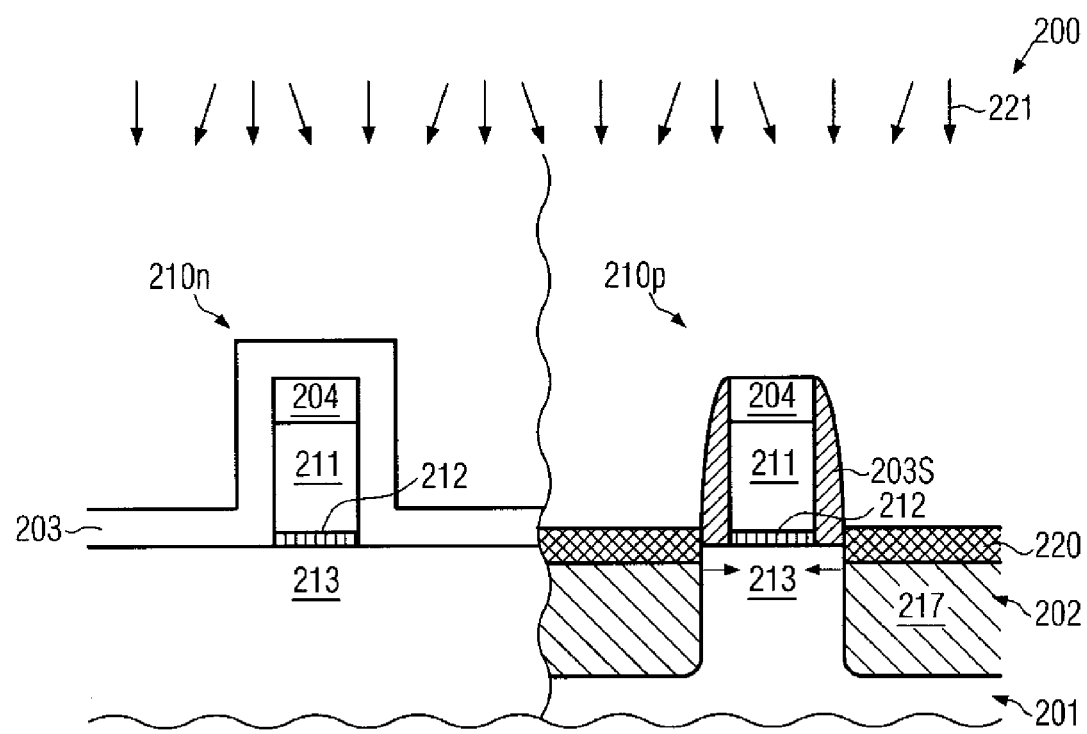
FIGS. 2a-2b schematically illustrate cross-sectional views of a semiconductor device including a P-channel transistor receiving a strained silicon/germanium material, which may be selectively covered by a protection layer according to illustrative embodiments.

FIG. 2a schematically illustrates a cross sectional view of a semiconductor device 200 comprising a first transistor 210p, which may represent a P-type transistor, and a second transistor 210n, which may represent an N-type transistor or any other transistor element or device, which may not receive a silicon/germanium material. The semiconductor device 200 may comprise a substrate 201 in the form of any appropriate carrier material for forming thereabove a respective silicon-based semiconductor layer 202, which may include other components, such as germanium and the like, depending on the device requirements. In some illustrative embodiments, the semiconductor layer 202 and the substrate 201 may be provided as an SOI configuration, wherein, for convenience, a respective buried insulating layer, such as a silicon dioxide layer and the like, is not shown in FIG. 2a. In other cases, the semiconductor device 200 may represent a bulk configuration, wherein the semiconductor layer 202 may represent an upper portion of a substantially crystalline substrate material. It should be appreciated that the semiconductor device 200 may comprise different device regions with different architectures in accordance with device requirements. For instance, SOI regions and bulk regions may be commonly provided in the semiconductor device 200, wherein, for instance, high performance transistors may be provided in an SOI configuration while other device areas, such as static RAM areas of advanced microprocessors and the like, may be formed on the basis of a bulk device architecture.

The transistors 210p, 210n may comprise, at this manufacturing stage, respective gate electrodes 211, formed on respective gate insulation layers 212, which separate the gate electrodes 211 from respective channel regions 213. As previously explained, the channel region 213 may represent a portion of a corresponding active region corresponding to the respective transistor element and defined in the semiconductor layer 202, for instance on the basis of appropriate isolation structures (not shown), such as shallow trench isolations and the like. Furthermore, respective cap layers 204 may cover the top surfaces of the gate electrodes 211, wherein the gate electrode 211 of the P-type transistor 210 may be covered by respective sidewall spacers 203S, while the second transistor 210n may be entirely covered by a spacer layer 203.

The components of the first and the second transistors 210p, 210n described so far may be formed on the basis of substantially the same process techniques as previously described with reference to the device 100. That is, after forming the gate insulation layers 212 and the gate electrodes 211, including the respective cap layers 204, the spacer layer 203 may be deposited and etched in the first transistor 210p so as to form the spacers 203S, which in combination with the spacer layer 203 may act as a growth mask after forming respective recesses in the first transistor 210p as previously described, followed by a selective epitaxial growth process for forming a silicon/germanium material 217. In some illustrative embodiments, the germanium concentration of the material 217 may be higher than approximately 20 atomic percent in order to provide a moderately high strain in the adjacent channel region 213. After the corresponding selective epitaxial growth process, the device 200 may be treated by a surface modification process 221 in order to form a corresponding protection layer 220 selectively on the silicon/germanium material 217. In one illustrative embodiment, the surface modification process 221 may represent an oxidation process performed in an oxidizing ambient on the basis of a respective gas atmosphere. For instance, the process 221, when performed as an oxidation process, may comprise a treatment at elevated temperatures in a corresponding gaseous atmosphere including oxygen in order to initiate a corresponding silicon/germanium oxide growth for forming the protection layer 220. Since respective oxidation growth rates for crystalline silicon/germanium material for various germanium concentrations may be known in advance or the corresponding values may be determined on the basis of respective experiments, a thickness of the protection layer 220, when formed on the basis of an oxidation process, may be readily controlled by the process parameters of the process 221. For example, for otherwise well-defined process parameters, such as temperature, oxygen concentration, etc., the respective treatment time may be used for creating a desired layer thickness for the layer 220. In some illustrative embodiments, a thickness of approximately 20 Å to 100 Å may be selected depending on the process requirements. Appropriate values for the thickness of the layer 220, depending on the material composition thereof, may be determined by respective test measurements, in which a plurality of manufacturing processes, previously identified as causing significant material loss in the silicon/germanium region 217, may be performed in the presence of a corresponding test layer in order to determine a respective material removal during these manufacturing processes, thereby obtaining an appropriate target thickness value for the respective manufacturing sequence and the material composition of the layer 220 under consideration.

In other illustrative embodiments, the surface modification process 221 may be performed as any other appropriate oxidation process, for instance on the basis of an oxygen plasma and the like. In still other cases, the oxidation 221 may be performed on the basis of a wet chemical process, wherein even substantially self-limiting processes may be used, thereby also providing a high degree of controllability of the respective thickness of the layer 220. Consequently, only a small amount of the silicon/germanium material 217, compared to the material loss occurring with non-protected silicon/germanium, may be "consumed" by the surface modification treatment 221. In other illustrative embodiments, the modification process 221 may comprise, in addition to or alternatively to an oxidation process, any other processes for endowing the protection layer 220 with significantly enhanced resistance with respect to material removal during the subsequent manufacturing processes. For instance, the treatment 221 may include a respective implantation or plasma treatment for incorporating carbon into the surface area of the silicon/germanium material in order to form a silicon carbide like material, which may have a high resistivity against a plurality of wet chemical etch recipes. Additionally, an oxygen plasma treatment may be performed in order to densify the corresponding surface portion, while consuming a significantly reduced amount of the silicon/germanium material 217.

After forming the protection layer 220 selectively on the silicon/germanium material 217, further manufacturing processes may be performed in accordance with process requirements. That is, the masking materials, i.e., the spacers 203S, the cap layers 204 and the spacer layer 203, may be removed selectively to silicon and the protection layer 220. For instance, highly selective etch recipes are well established in the art for silicon, silicon dioxide and silicon nitride. However, even a minor degree of material removal of the protection layer 220 may not adversely affect the further processing, since a corresponding material loss may have been taken into consideration when appropriately selecting the corresponding target thickness of the protection layer 220. Thereafter, further manufacturing processes may be performed, for instance including respective cleaning processes, resist forming and removing sequences, which may have a significant influence on non-protected silicon/germanium materials, in particular if high germanium concentrations are present, as is previously discussed. It should be appreciated that many of these processes may exhibit a moderately high variability, in particular respective cleaning processes, which may, in conventional strategies, result in a significant variation of the observed material loss, thereby also resulting in corresponding device variations, even if the material loss may be compensated for by a significant increase of the thickness of the initially epitaxially grown silicon/germanium material. Hence, according to the provision of the protection layer 220, respective variations in the manufacturing processes may be accommodated by the layer 220 substantially without affecting the underlying silicon/germanium material 217. Therefore, a well-defined and low material removal during the treatment 221 prior to further critical processes, compared to significant material losses in the conventional process flow, may provide significantly enhanced process stability and performance uniformity of the device 210p.

Figure 2B:
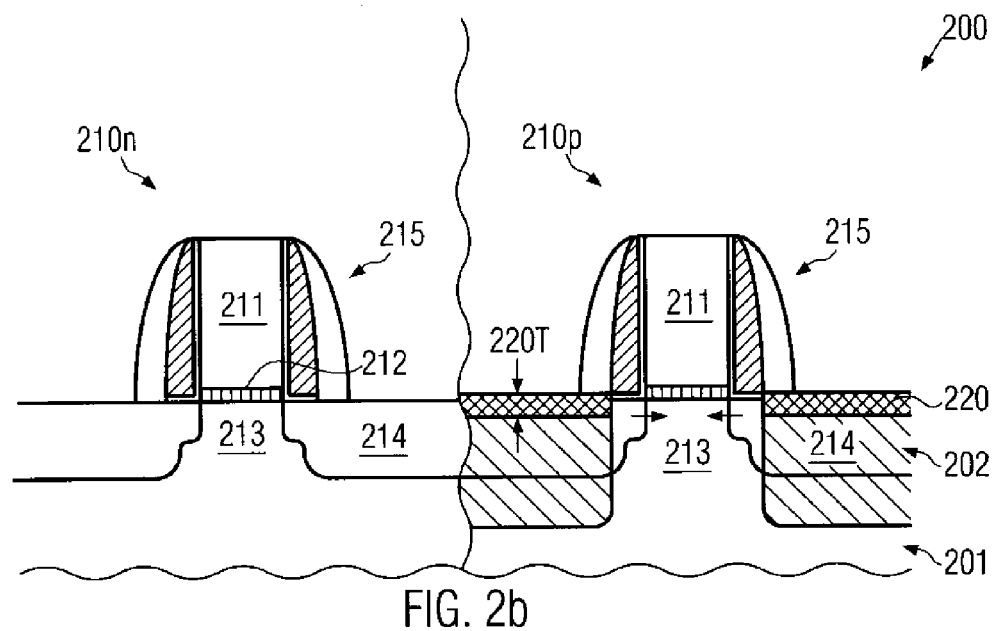

FIG. 2b schematically illustrates the semiconductor device 200 in a further advanced manufacturing stage, in which the respective transistors 210p, 210n may have respective sidewall spacer structures 215 and drain and source regions 214 in accordance with device requirements. The drain and source regions 214 may be formed on the basis of respective implantation sequences, wherein, in the P-channel transistor 210p, respective process parameters, such as implantation energy and dose, may be adapted so as to take into account the presence of the protection layer 220. It should be appreciated that a thickness 220T of the layer 220, after respective aggressive cleaning processes in other manufacturing steps, may be reduced compared to the initial layer thickness due to a respective material removal, wherein such a reduced thickness may be taken into consideration when establishing appropriate process parameters for the implantation process. For example, the actual material removal during the preceding processes may be readily determined on the basis of layer thickness measurement performed on respective measurement sites having formed thereon the protection layer 220. Thus, even strongly varying conditions during previous processes may be compensated for, thereby further enhancing process and device uniformity.

Consequently, the semiconductor device 200 as shown in FIG. 2b may be formed on the basis of a well-established process strategy, wherein slight modifications of respective implantation sequences may be used in order to appropriately design the dopant profile of the drain and source regions 214 of the transistor 210p. Thereafter, the protection layer 220 may be removed, for instance on the basis of a selective isotropic or anisotropic etch process, for which respective etch chemistries are well established in the art. In some illustrative embodiments, the protection layer 220 may be removed by a highly isotropic etch process, thereby obtaining a certain degree of under-etching of the spacer structure 215. Consequently, a respective metal silicide, which may be formed in the drain and source regions 214 and the gate electrode 211 in a later manufacturing stage, may be located more closely to the channel region 213, without requiring the removal of the spacer structure 215. In other illustrative embodiments, the spacer structure 215, or at least a portion thereof, may be removed prior to or after the removal of the protection layer 220 and respective metal silicide regions may be subsequently formed.

Figure 2C:
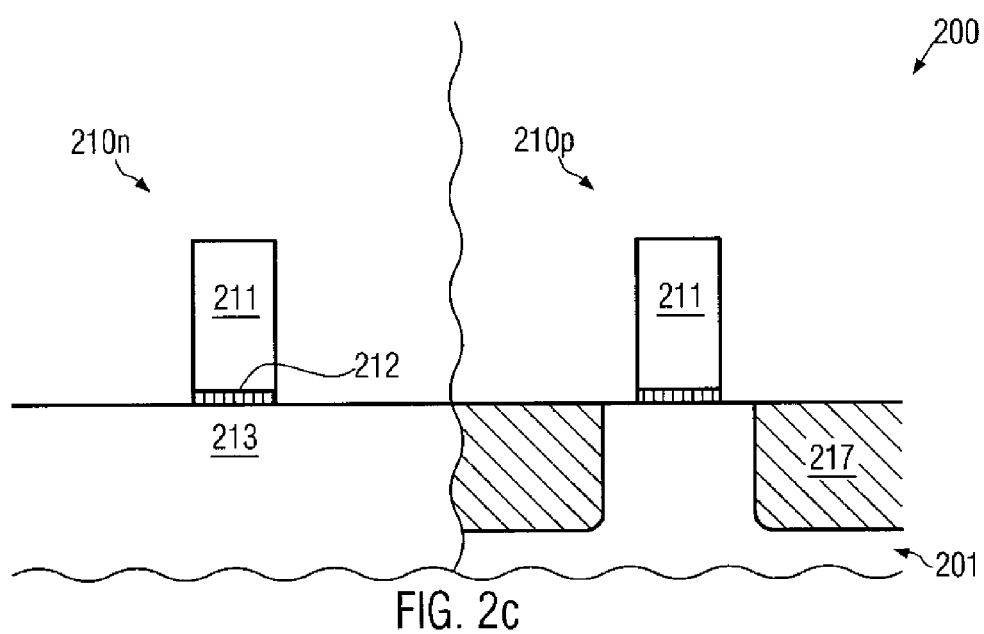
FIGS. 2c-2e schematically illustrate cross-sectional views of a semiconductor device including a P-type transistor receiving a silicon/germanium material of high concentration, wherein a protection layer may be formed by oxidation in exposed N-type transistors and P-type transistors with a subsequent removal of oxide according to illustrative embodiments.
Figure 2D:
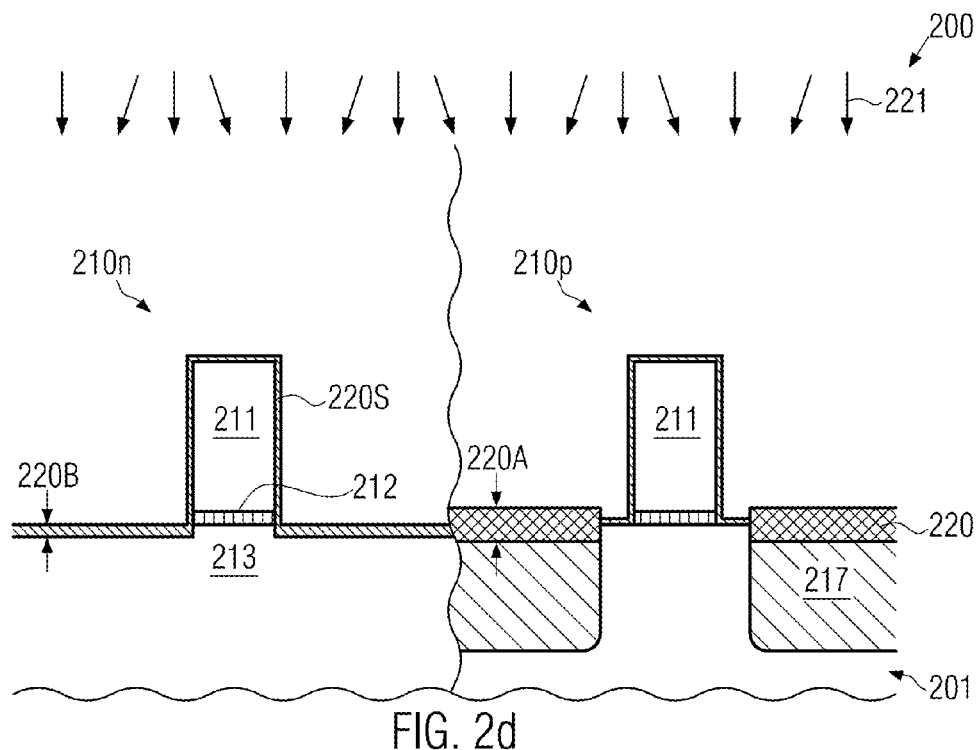
Figure 2E:
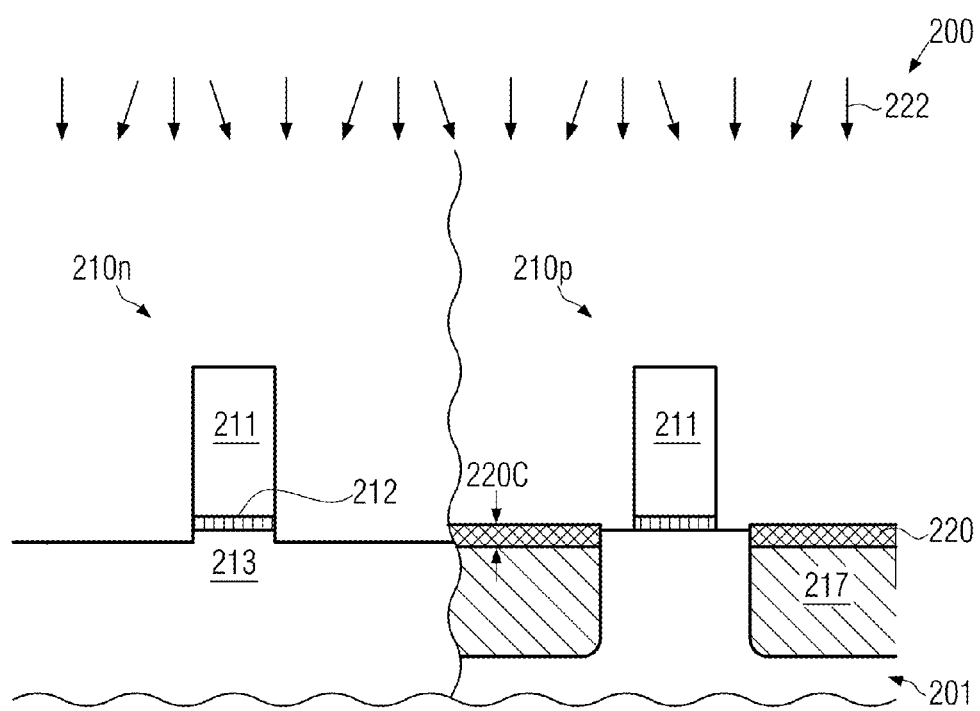

With reference to FIGS. 2c-2e, further illustrative embodiments will now be described, in which the protection layer may be formed selectively in the P-transistor after removal of any masking material.

FIG. 2c schematically illustrates the semiconductor device 200 in a manufacturing stage in which the silicon/germanium material 217 is formed and wherein a corresponding masking material, i.e., the spacers 203S, cap layers 204 and the spacer layer 203 (FIG. 2a) have been removed.

FIG. 2d schematically illustrates the semiconductor device 200 during the surface modification process 221, which now acts on both transistors 210p, 210n. The treatment 221 may comprise an oxidation process, wherein, as previously explained, the oxidation rate of silicon/germanium material may be higher compared to pure silicon material, wherein an increasing concentration of germanium may further increase the corresponding oxidation rate. Consequently, for given process parameters of the treatment 221, adjusted so as to obtain a thickness 220A of the corresponding protection layer 220 in accordance with a target thickness in the transistor 210p, a corresponding layer 220S may also be formed in the second transistor 210n, however with a significantly reduced thickness 220B. While, in some illustrative embodiments, the further processing may be continued on the basis of both layers 220S and 220, in other illustrative embodiments, the layer 220S may be removed from the second transistor 210n, thereby providing a high degree of process compatibility with conventional process techniques in processing N-type transistors. In this case, the initial thickness 220A of the protection layer 220 may be selected to accommodate a respective anticipated material loss during a subsequent process for removing the layer 220S from the transistor 210n in order to obtain the finally desired target thickness for providing sufficient protection during the further processing.

FIG. 2e schematically illustrates the semiconductor device 200 during a corresponding selective etch process 222 for removing silicon dioxide, for instance on the basis of wet chemical etch recipes, plasma-based etch recipes and the like. Hence, the layer 220S may be substantially completely removed, thereby providing similar process conditions for the transistor 210n during the further processing as in conventional strategies, as described above, while the protection layer 220 in the first transistor 210p may be reduced to the target thickness 220C, which may be appropriately selected to protect the transistor 210p during the further processing, as described above. Thereafter, the subsequent manufacturing steps may be performed as described above.

Consequently, the protection layer 220 may be formed in a selective manner on exposed portions of the first transistor 210p substantially without affecting the transistor 210n, wherein the self-aligned nature of the corresponding process sequences may not require any lithography steps, thereby contributing to process efficiency.

Figure 2F:
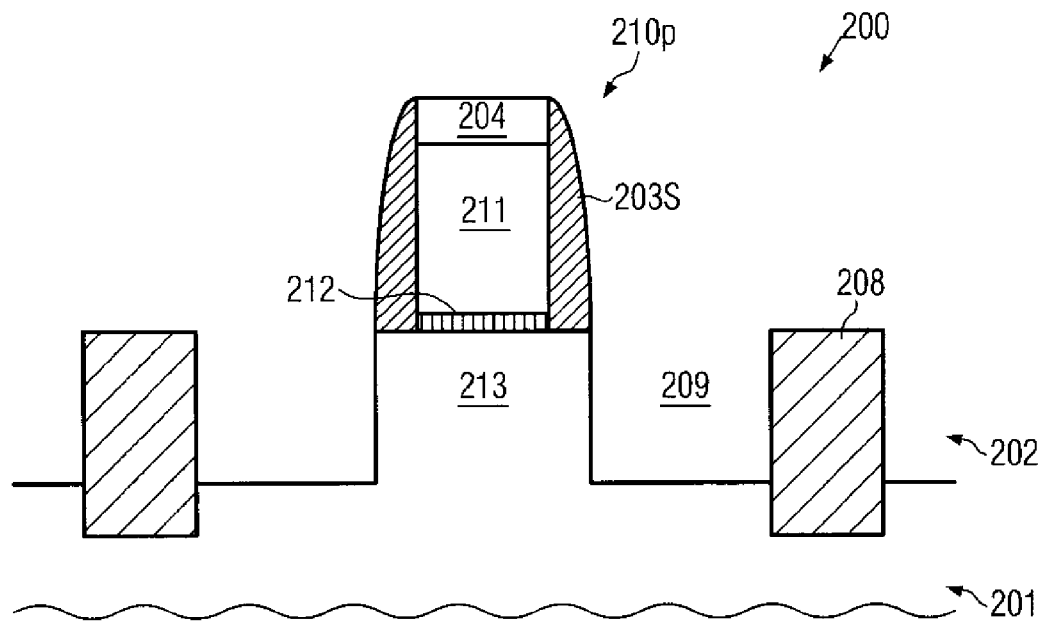
FIGS. 2f-2h schematically illustrate cross-sectional views of a P-type transistor during various manufacturing stages in forming a silicon/germanium material with a moderately low excess height for compensating for material loss created during the formation of a protection layer according to still further illustrative embodiments.
Figure 2G:
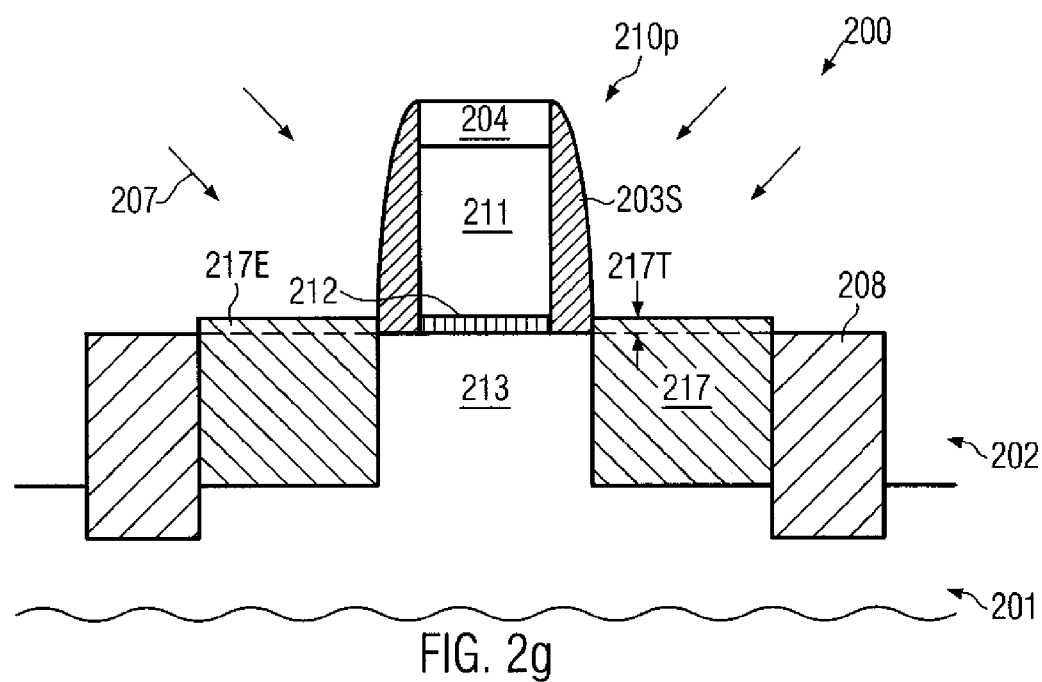
Figure 2H:
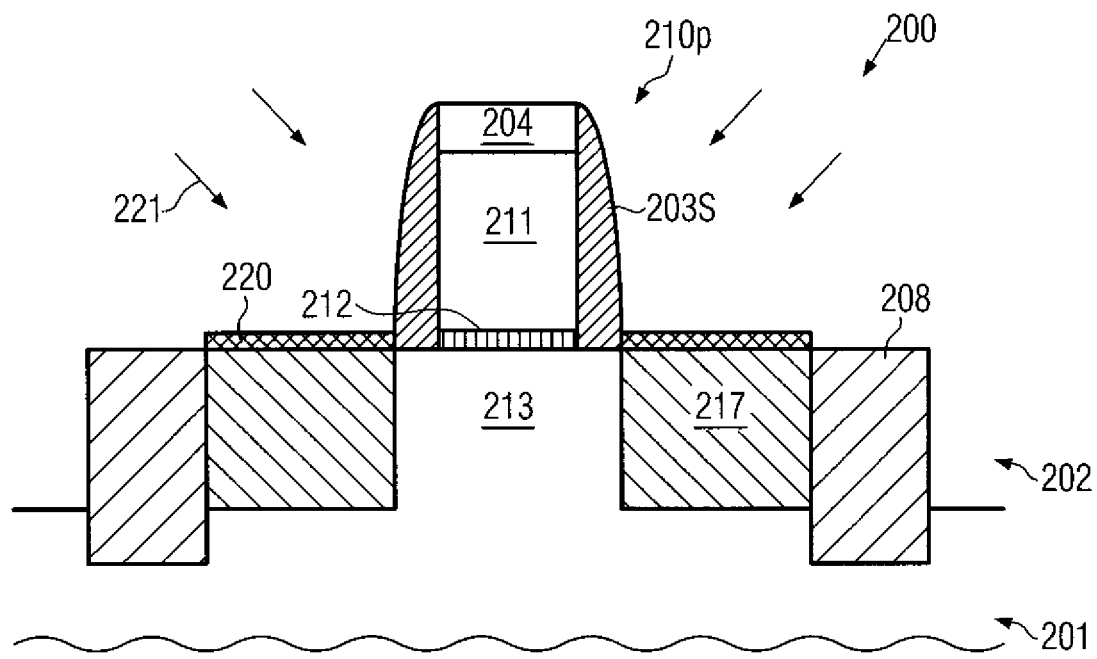

With reference to FIGS. 2f-2h, further illustrative embodiments will now be described in which a minor material loss caused by the formation of the protection layer 220 may be compensated for by a correspondingly adapted epitaxial growth process.

FIG. 2f schematically illustrates the transistor 210p after a corresponding etch process for forming respective cavities or recesses 209 adjacent to the channel region 213 and respective isolation structures 208.

FIG. 2g schematically illustrates the transistor 210p when subjected to the corresponding selective epitaxial growth process 207 for forming the silicon/germanium material 217 having the desired high concentration of germanium material. In the process 207, the respective process parameters, such as deposition time, may be controlled such that a certain amount of excess material 217E may be formed above the height level defined by a lower surface of the gate insulation layer 212. Thus, a respective additional height 217T may be created during the deposition process 207, wherein the height 217T may be adjusted to a respective material consumption caused by the surface modification process 221, as previously described. Since the corresponding material loss may be known in advance or may be readily determined on the basis of respective tests, the thickness 217T of the excess material 217E may be readily adjusted. Since the excess material 217E may be provided with a low thickness, a corresponding additional deposition time may be low and may substantially not affect the overall throughput.

It should be appreciated that the excess material 217E may not necessarily be provided with the same material composition as the silicon/germanium material 217, since the excess material 217E may represent a sacrificial material used for the formation of a respective protection layer, which may be removed during the further processing. For example, the excess material 217E may be provided in the form of a silicon/germanium material having a significantly reduced concentration of germanium or the excess material 217E may be provided as a substantially pure silicon material when the corresponding characteristics of silicon during the modification process 221 are considered superior compared to the silicon/germanium material. In some illustrative embodiments, the excess material may itself act as the protection layer 220, when a substantially pure silicon material is deposited in the final phase of the process 207.

FIG. 2h schematically illustrates the transistor 210p during the modification process 221, in which the excess material 217E may be converted into the protection layer 220, wherein a substantially flush configuration may be obtained. That is, the silicon/germanium material 217 may act laterally on the channel region 213 at a height level substantially corresponding to the height level of the gate insulation layer 212, when the thickness 217T has been selected so as to substantially correspond to the material consumption during the treatment 221. Thus, an even increased performance gain may be obtained, due to a more efficient stress transfer mechanism, while only moderately contributing to higher efforts in terms of deposition time during the process 207. Thereafter, the further processing may be continued, as previously described, wherein the silicon/germanium material 217 may substantially maintain its height level due to the protection layer 220.

Figure 3A:
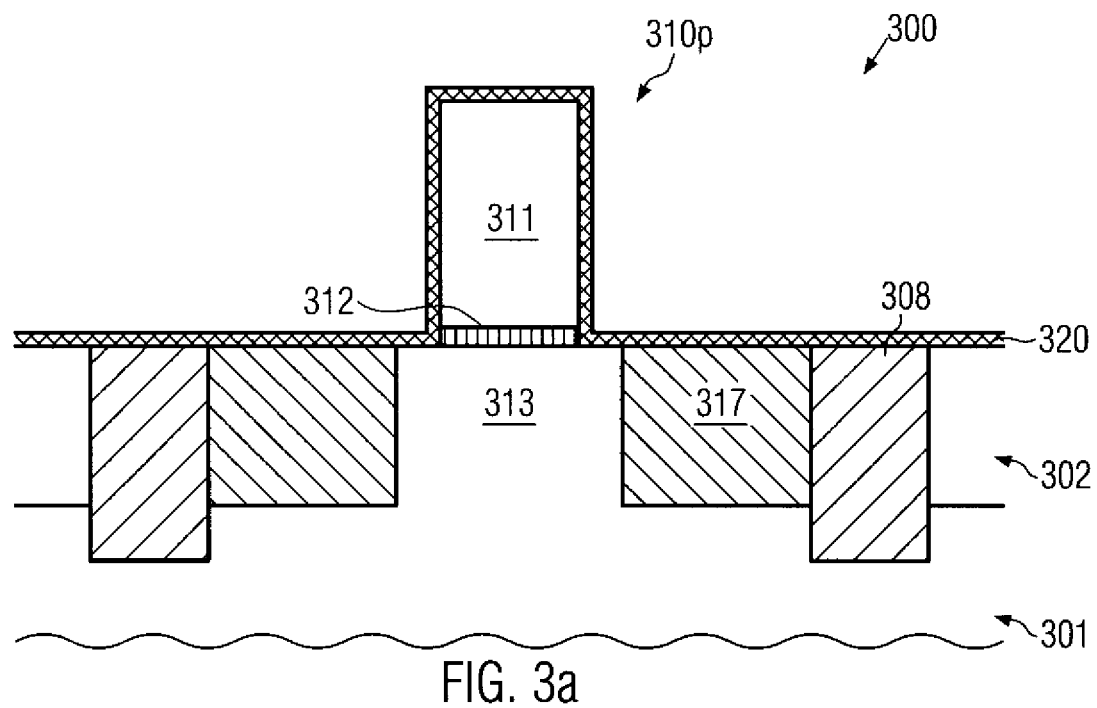
FIGS. 3a-3c schematically illustrate cross-sectional views of a P-type transistor during various manufacturing stages in forming a silicon/germanium material on the basis of an efficient protection layer formed by a deposition process according to yet other illustrative embodiments.
Figure 3B:
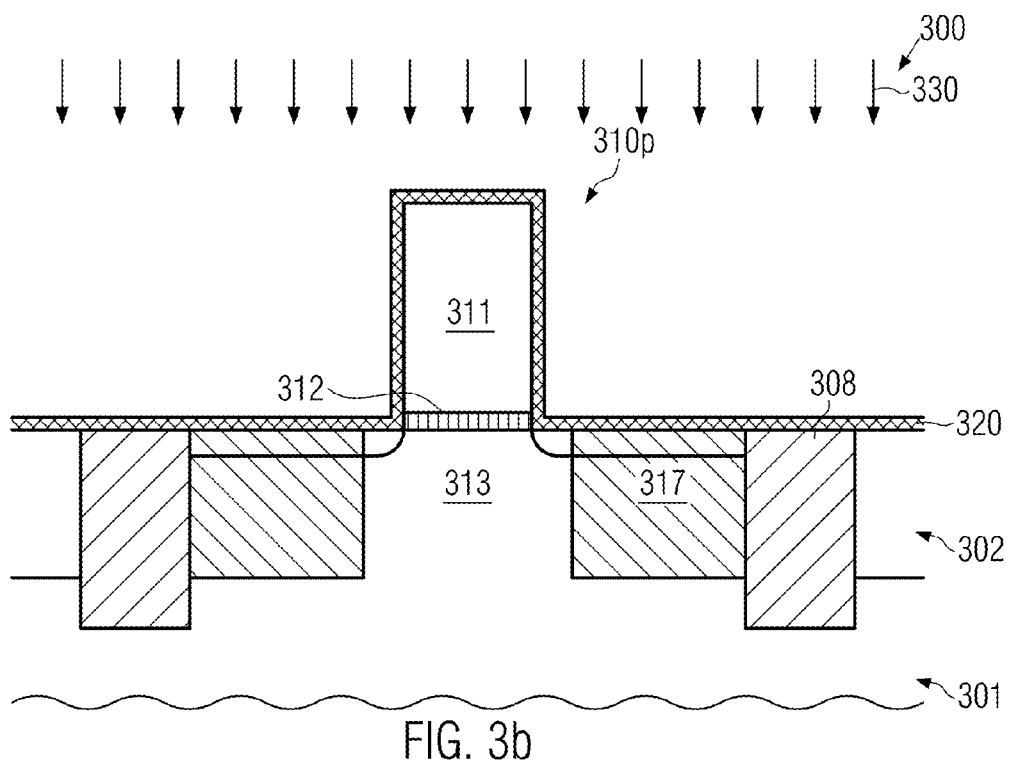
Figure 3C:
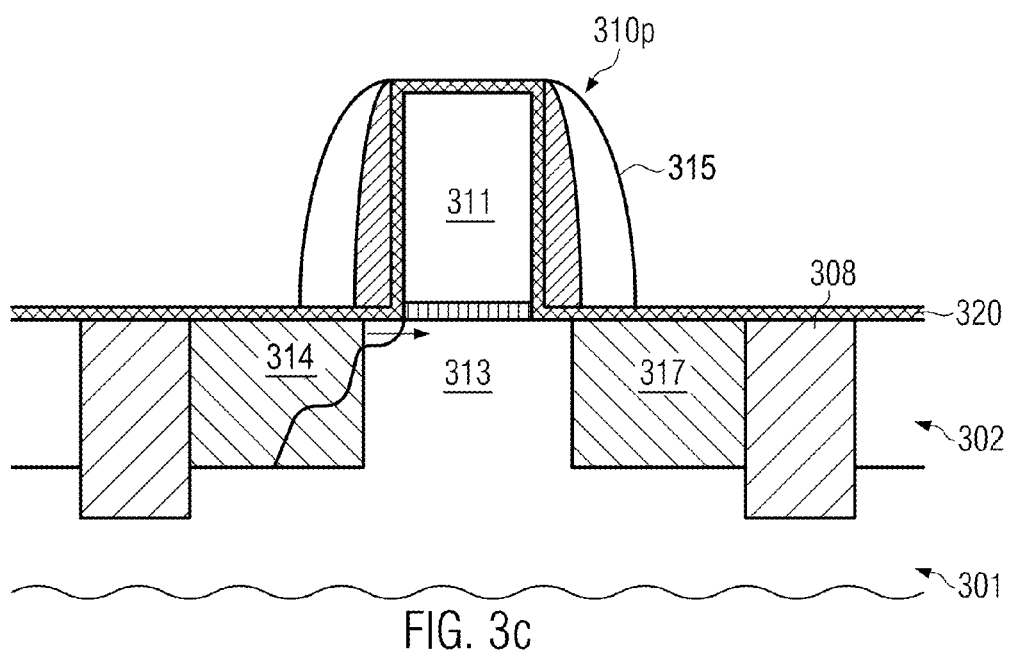

With reference to FIGS. 3a-3c, further illustrative embodiments will now be described, in which a corresponding protection layer may be formed on the basis of a deposition process.

FIG. 3a schematically illustrates a semiconductor device 300 comprising a P-type transistor 310p, the performance of which is to be increased on the basis of strained silicon/germanium material, as previously explained. The device 300 may comprise a substrate 301 and a corresponding semiconductor layer 302, in which a respective active region for a transistor 310p may be defined. Furthermore, a respective gate electrode 311 formed above a channel region 313 and separated therefrom by a gate insulation layer 312 are provided. Furthermore, in this manufacturing stage, a silicon/germanium material 317 having a high concentration of germanium may be formed within the semiconductor layer 302. With respect to the components described so far, the same criteria apply as previously explained with reference to the device 200. Furthermore, a protection layer 320 is formed on the transistor 310p and may be comprised of any appropriate material, such as silicon dioxide, silicon nitride and the like. The protection layer 320 may be formed on the basis of any appropriate deposition technique, such as PECVD using appropriate precursor gasses, for instance TEOS, when a silicon dioxide layer is considered. The thickness of the protection layer 320 may be selected so as to withstand the subsequent manufacturing processes without substantially exposing the silicon/germanium material 317, as is previously explained. Thus, the corresponding thickness of the layer 320 may be adapted in accordance with process requirements and the material composition of the layer 320. In other illustrative embodiments, the thickness of the protection layer 320 may be selected in accordance with process requirements for a subsequent implantation process for forming respective extension regions in the semiconductor layer 302, where the protection layer 320 may thus act as an offset spacer, while, in other illustrative embodiments, respective sidewall spacers may be additionally formed, if required.

FIG. 3b schematically illustrates the device 300 during subsequent manufacturing processes, for instance, an implantation process 330 for introducing dopants into the semiconductor layer 302 and the material 317 in accordance with process and device requirements. During any preceding cleaning processes for preparing the device 300 for the implantation process 330, the protection layer 320 may reliably prevent an undue exposure of the silicon/germanium material 317, as previously explained. Furthermore, the implantation parameters of the process 330 may be selected to compensate for the ion blocking characteristics of the protection layer 320 and also for any migration of dopants from the semiconductor layer 302 and the material 317 into the protection layer 320. In other illustrative embodiments, the protection layer 320 may be provided as a highly doped dielectric material in order to reduce a possible dopant gradient during the further processing of the device 300, thereby avoiding undue dopant loss during further process steps without requiring increased implantation doses during the process 330 and any further implantation processes. Furthermore, the thickness and the material composition of the protection layer 320 may be selected such that, in addition to substantially preventing exposure of the material 317, an undue lateral straggle of the ion bombardment during the implantation 330 may not significantly occur. As previously explained, an appropriate target thickness for the protection layer 320 may be defined on the basis of respective test runs, wherein a minimum thickness may be readily determined to withstand the subsequent manufacturing processes covering a certain range of variability in these processes.

FIG. 3c schematically illustrates the semiconductor device 300 in a further advanced manufacturing stage. A spacer structure 315 may be provided on sidewalls of the gate electrode and respective drain and source regions 314 may be formed by ion implantation, wherein respective criteria, at least in view of the implantation energy, may also be taken into consideration to obtain the desired lateral and vertical dopant profile. Thus, the silicon/germanium material 317 may provide the respective stress vertically across the entire channel region 313 due to the presence of the protection layer 320 in the preceding manufacturing processes. The further processing may be continued by removing exposed portions of the protection layer 320, for instance on the basis of well-established selective etch techniques, and forming respective metal silicide regions, if required.

Consequently, the protection layer 320 may be formed of any appropriate material, thereby resulting in increased flexibility for designing the overall process flow, wherein any material loss of the silicon/germanium material 317 may be reliably suppressed. The additional material during the further processing may be readily taken into account by adapting the implantation parameters, wherein these adaptations may also be performed for N-type transistors, when the protection layer 320 may not be removed from the N-type transistors.

As a result, the subject matter disclosed herein provides an enhanced technique for using silicon/germanium material with high germanium contents without generating a significant material loss and without requiring significant over-deposition times during a corresponding selective epitaxial growth process, which would be required when a corresponding material loss is to be compensated for by additional silicon/germanium material. For this purpose, an efficient protection layer may be provided, for instance in a highly self-aligned manner or in the form of a deposited layer, thereby providing a high degree of process compatibility with respect to transistor elements including low germanium concentrations while nevertheless providing a significant performance gain. Thus, an extensive silicon/germanium overfill, which may lower throughput of the epitaxial process in conventional approaches, and significant implantation adjustments associated with the significant overfill may be avoided. The provision of a respective protection layer may significantly reduce any material loss or may even provide a substantially flush configuration without requiring substantial changes with respect to the overall process flow, except for "mild" adaptations of the respective implantation process and, if desired, of the epitaxial growth process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a masking material above a gate electrode of a P-type transistor, wherein said masking material covers sidewall and upper surfaces of said gate electrode;
    forming a strained silicon/germanium material in a recess formed adjacent to said masked gate electrode of said P-type transistor;
    forming a protection layer above said P-type transistor while said masking material covers said sidewall and upper surfaces of said gate electrode, wherein at least a first portion of said protection layer completely covers said strained silicon/germanium material; and
    forming drain and source regions at least partially in said silicon/germanium material in the presence of said protection layer, wherein forming said drain and source regions comprises performing an implantation process to implant P-type dopants through said first portion of said protection layer.

2. The method of claim 1, wherein said protection layer is formed in an oxidizing ambient.

3. The method of claim 2, wherein said oxidizing ambient is established in a gaseous ambient.

4. The method of claim 2, wherein additional material is formed adjacent said gate electrode of said P-type transistor, said additional material being provided with extra height relative to a bottom surface of a gate insulation layer of said P-type transistor so as to compensate for material loss when forming said protection layer in said oxidizing ambient.

5. The method of claim 4, wherein said additional material comprises silicon/germanium.

6. The method of claim 4, wherein said additional material is substantially silicon.

7. The method of claim 1, wherein said protection layer is formed on said silicon/germanium layer with an initial thickness of approximately 20 Å or more.

8. The method of claim 1, further comprising removing said protection layer prior to forming a metal silicide on said drain and source regions of said P-type transistor.

9. The method of claim 1, wherein forming said protection layer comprises, after forming said strained silicon/germanium material in said recess, incorporating carbon into a surface area of said strained silicon/germanium material by performing one of an implantation or plasma treatment process.

10. A method, comprising:
   selectively forming a protection layer on a silicon/germanium material formed in an active region of a P-type transistor, wherein selectively forming said protection layer comprises masking upper and sidewall surfaces of a gate electrode of said P-type transistor so as to prevent said protection layer from being formed thereon, said selectively formed protection layer completely covering said silicon/germanium material; and
   forming drain and source regions in said active region of said P-type transistor and in an active region of an N-type transistor after selectively forming said protection layer, wherein forming said drain and source regions in said active region of said P-type transistor comprises performing an ion implantation process in the presence of said selectively formed protection layer to implant dopants therethrough.

11. The method of claim 10, wherein said protection layer is formed by an oxidation process.

12. The method of claim 11, wherein selectively forming said protection layer comprises oxidizing said silicon/germanium material while masking said N-type transistor.

13. The method of claim 11, further comprising forming said silicon/germanium material with excess height in said active region of the P-type transistor, said excess height substantially compensating for a material loss of said silicon/germanium material when exposed to said oxidizing ambient.

14. The method of claim 10, wherein selectively forming said protection layer comprises, after selectively forming said silicon/germanium material in said active region of said P-type transistor, incorporating carbon into a surface area of said silicon/germanium material by performing one of an implantation or plasma treatment process.

15. A method, comprising:
   forming a protection layer to completely cover a silicon/germanium material formed in an active region of a P-type transistor, wherein forming said protection layer comprises oxidizing an exposed surface of said silicon/germanium material while masking upper and sidewall surfaces of a gate electrode of said P-type transistor;
   performing an implantation process in the presence of said protection layer to implant dopants therethrough, wherein process parameters of said implantation process are determined on the basis of a thickness and material composition of said protection layer; and
   removing said protection layer prior to forming a metal silicide at least partially in said silicon/germanium material formed in said P-type transistor.

16. The method of claim 15, wherein a thickness of said protection layer is in a range of approximately 20-100 Å.

* * * * *